US008592968B2

(12) United States Patent
Shibuya

(10) Patent No.: US 8,592,968 B2
(45) Date of Patent: Nov. 26, 2013

(54) SEMICONDUCTOR DEVICE, SEMICONDUCTOR PACKAGE, INTERPOSER, SEMICONDUCTOR DEVICE MANUFACTURING METHOD AND INTERPOSER MANUFACTURING METHOD

(75) Inventor: Koujirou Shibuya, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/563,560

(22) Filed: Jul. 31, 2012

(65) Prior Publication Data

US 2012/0299193 A1  Nov. 29, 2012

Related U.S. Application Data

(63) Continuation of application No. 12/929,665, filed on Feb. 7, 2011, now Pat. No. 8,258,617.

(30) Foreign Application Priority Data

Feb. 15, 2010 (JP) ................. 2010-030438

(51) Int. Cl.
*H01L 23/52* (2006.01)
*H01L 23/48* (2006.01)

(52) U.S. Cl.
USPC ...... 257/692; 257/E23.02; 257/676; 257/698; 257/784; 438/126; 438/612

(58) Field of Classification Search
USPC ............... 257/E21.499, E23.01, E23.02, 438, 257/676, 686, 690, 692, 697, 698, 700, 762, 257/772, 774, 778, 784, 786; 438/106, 108, 438/122, 126, 612; 174/257, 260, 261; 29/829

See application file for complete search history.

(56) References Cited

U.S. PATENT DOCUMENTS

| 5,726,501 | A | 3/1998 | Matsubara | 257/778 |
|---|---|---|---|---|
| 6,118,180 | A | 9/2000 | Loo et al. | 257/737 |
| 6,396,707 | B1 | 5/2002 | Huang et al. | 361/760 |
| 6,469,393 | B2 | 10/2002 | Oya | 257/779 |
| 6,483,191 | B2 * | 11/2002 | Umezaki | 257/738 |
| 6,717,264 | B2 | 4/2004 | Ho et al. | 257/738 |
| 6,781,234 | B2 | 8/2004 | Hayashida | 257/738 |
| 6,791,178 | B2 | 9/2004 | Yamaguchi et al. | 257/699 |

(Continued)

FOREIGN PATENT DOCUMENTS

| JP | 10-313167 | 11/1998 |
|---|---|---|
| JP | 2003-23243 | 1/2003 |

*Primary Examiner* — Chris Chu
(74) *Attorney, Agent, or Firm* — McGinn IP Law Group, PLLC

(57) ABSTRACT

A semiconductor device includes an interposer having a base member including a first surface and a second surface opposite to the first surface, a first interconnect formed on the first surface of the base member, a first insulating film formed on the first surface of the base member, a first external terminal and a second external terminal neighboring the first external terminal formed on the second surface of the base member, a second interconnect formed on the second surface of the base member and passing between the first external terminal and the second external terminal, and a second insulating film formed on the second surface of the base member, a semiconductor chip mounted on the first insulating film, a sealing resin formed on the first insulating film and sealing the semiconductor chip. The second insulating film has an opening so that the second interconnect is exposed in an area.

10 Claims, 8 Drawing Sheets

(56) References Cited

U.S. PATENT DOCUMENTS

| | | | |
|---|---|---|---|
| 6,924,987 B2 | 8/2005 | Sugimoto et al. | 361/794 |
| 6,958,527 B2 | 10/2005 | Hanaoka | 257/668 |
| 6,961,230 B2 | 11/2005 | Otsuka et al. | 361/306.2 |
| 7,046,501 B2 | 5/2006 | Tsuji | 361/306.2 |
| 7,053,315 B2 | 5/2006 | Orui et al. | 174/267 |
| 7,098,540 B1 | 8/2006 | Mohan et al. | 257/773 |
| 7,315,085 B2 | 1/2008 | Liu | 257/773 |
| 7,347,348 B2 | 3/2008 | Koopmans | 228/11 |
| 7,508,079 B2 | 3/2009 | Higashi | 256/774 |
| 7,510,912 B2 | 3/2009 | Caletka et al. | 438/122 |
| 7,554,039 B2 * | 6/2009 | Yokozuka et al. | 174/252 |
| 7,622,377 B2 | 11/2009 | Lee et al. | 438/612 |
| 7,755,203 B2 | 7/2010 | Nishimura et al. | 257/778 |
| 7,838,975 B2 * | 11/2010 | Chen | 257/676 |
| 7,999,189 B2 | 8/2011 | Chen et al. | 174/257 |
| 8,008,583 B2 * | 8/2011 | Kariya et al. | 174/260 |
| 8,063,846 B2 | 11/2011 | Imaoka et al. | 343/851 |
| 8,067,695 B2 * | 11/2011 | Kaneko | 174/250 |
| 2001/0025723 A1 | 10/2001 | Kondo et al. | 174/260 |
| 2002/0111054 A1 | 8/2002 | Huang et al. | 439/83 |
| 2003/0234118 A1 | 12/2003 | Hsu et al. | 174/262 |
| 2004/0012930 A1 | 1/2004 | Grigg | 361/743 |
| 2004/0041393 A1 | 3/2004 | Lee | 283/100 |
| 2007/0096327 A1 * | 5/2007 | Kawamura et al. | 257/774 |
| 2007/0152350 A1 * | 7/2007 | Kim et al. | 257/786 |

\* cited by examiner

SEMICONDUCTOR DEVICE, SEMICONDUCTOR PACKAGE, INTERPOSER, SEMICONDUCTOR DEVICE MANUFACTURING METHOD AND INTERPOSER MANUFACTURING METHOD

CROSS-REFERENCE TO RELATED APPLICATION

The present application is a Continuation Application of U.S. patent application Ser. No. 12/929,665, filed on Feb. 7, 2011, now U.S. Pat. No. 8,258,617 which is based on and claims priority from Japanese patent application No. 2010-30438, filed on Feb. 15, 2010, the entire contents of which is incorporated herein by reference.

BACKGROUND

1. Field of the Invention

The present invention relates to a semiconductor device in which a semiconductor package with an interposer is mounted over an interconnection substrate, a semiconductor package, an interposer, a semiconductor device manufacturing method, and an interposer manufacturing method.

2. Description of Related Art

For example, BGA packages and LGA packages are semiconductor packages. Semiconductor packages are anticipated to provide high reliability, particularly long-term reliability such as temperature cyclicity. If the temperature of a semiconductor device in which a semiconductor package is mounted over a printed wiring board changes, thermal stress generated due to the difference in thermal expansion coefficient between the printed wiring board and semiconductor package may affect a solder ball and cause a crack in the joint of the solder ball and an external coupling terminal of the package substrate or printed wiring board, resulting in a disconnection. Among techniques of preventing such disconnection are the techniques disclosed in Japanese Unexamined Patent Publication No. Hei 10(1998)-313167 and Japanese Unexamined Patent Publication No. 2003-023243.

These techniques use an NSMD structure in order to prevent solder balls from running on a solder resist layer. The techniques eliminate a notch which may cause cracking and also reduce the possibility that a molten solder ball spreads over a wire from an external coupling terminal and runs on the solder resist layer.

The technique described in Japanese Unexamined Patent Publication No. Hei 10(1998)-313167 uses an NSMD structure to decrease the width of the exposed portion of an interconnect wire. The technique described in Japanese Unexamined Patent Publication No. 2003-023243 uses an NSMD structure in which the exposed portion of an interconnect wire is covered by a solder resist layer. These techniques are described as further reducing the possibility that thermal stress of a solder ball is directly applied to the interconnect wire and disconnection of the interconnect wire occurs.

SUMMARY

However, the present inventors have found that a difference in thermal expansion coefficient as mentioned above may cause cracking in a solder resist layer covering the surface of an interposer between external coupling terminals and such cracking may lead to a wire disconnection. The inventors have also found it difficult for the above two conventional techniques to prevent disconnection of an interconnect wire passing between external coupling terminals.

According to a first aspect of the present invention, there is provided a semiconductor device which includes an interposer having a base member including a first surface and a second surface opposite to the first surface, a first interconnect formed on the first surface of the base member, a first insulating film formed on the first surface of the base member, a first external terminal and a second external terminal neighboring the first external terminal formed on the second surface of the base member, a second interconnect formed on the second surface of the base member and passing between the first external terminal and the second external terminal, and a second insulating film formed on the second surface of the base member, a semiconductor chip mounted on the first insulating film, a sealing resin formed on the first insulating film and sealing the semiconductor chip, wherein the second insulating film has an opening so that the second interconnect is exposed in an area where the second interconnect intersects with a line connecting centers of the first external terminal and the second external terminal.

According to the present invention, the possibility of disconnection of an interconnect wire passing between external coupling terminals in an interposer is reduced.

BRIEF DESCRIPTION OF THE DRAWINGS

FIGS. 3A to 3D are sectional views showing the method for manufacturing the interposer according to the first embodiment, in which FIG. 3A shows the process of making an interconnection pattern, FIG. 3B shows the process of making a solder resist layer, FIG. 3C shows the process of removing the solder resist layer selectively, and FIG. 3D shows the process of making coatings;

DETAILED DESCRIPTION OF THE PREFERRED EMBODIMENTS

Figure 1:
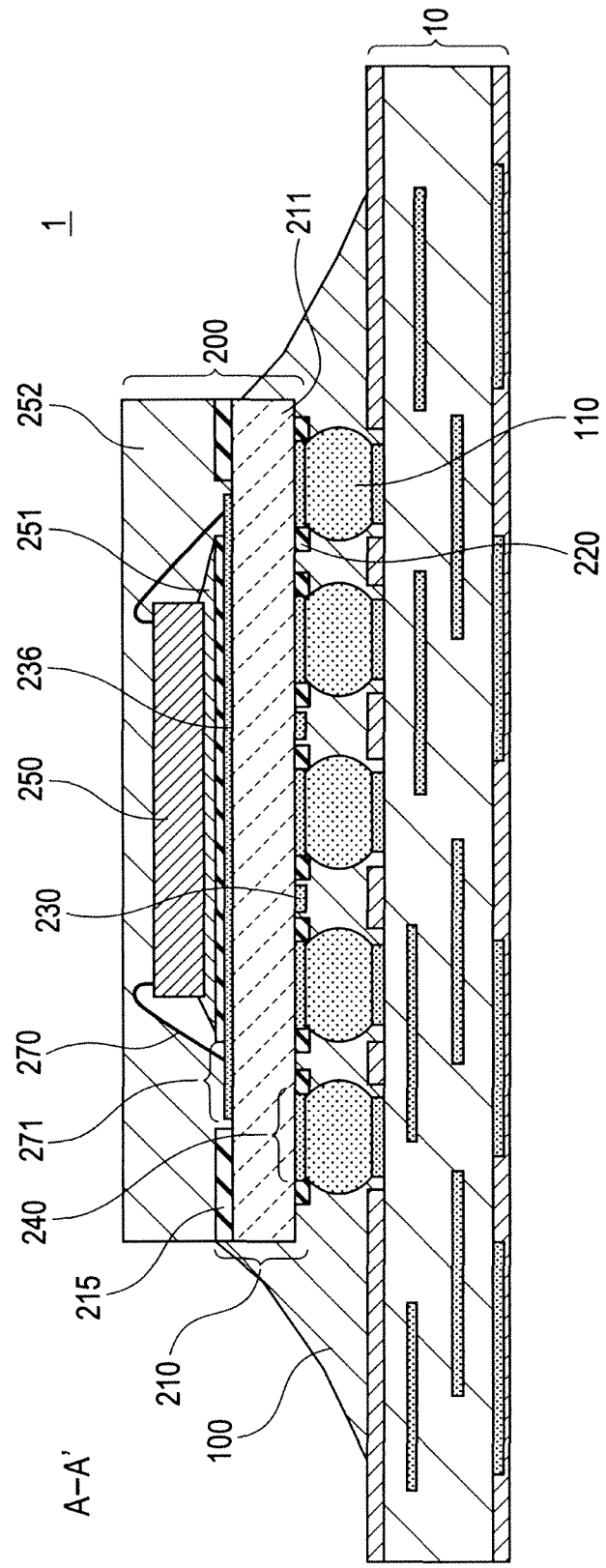
FIG. 1 is a sectional view showing the structure of a semiconductor device according to a first embodiment of the invention.

Next, the preferred embodiments of the present invention will be described in detail referring to the accompanying drawings. In all the drawings, the same elements are designated by the same reference numerals and repeated descriptions of such elements are omitted.

FIG. 1 is a sectional view showing the structure of a semiconductor device 1 according to a first embodiment of the invention. The semiconductor device 1 includes an interconnection substrate 10, a semiconductor package 200, and an underfill resin layer 100. The semiconductor package 200 includes a semiconductor chip 250 and an interposer 210. The interposer 210 has the semiconductor chip 250 mounted over one surface thereof and a plurality of external coupling terminals 240 and an interconnect wire 230 formed over the other surface and is covered by a solder resist layer 220. The semiconductor package 200 is mounted over the interconnection substrate 10, for example, through solder balls 110. The underfill resin layer 100 seals the space between the semiconductor package 200 and interconnection substrate 10. In an area where the interconnect wire 230 passing between two neighboring external coupling terminals 240 intersects with a line connecting the centers of the neighboring external coupling terminals 240, the interconnect wire 230 is not covered by the solder resist layer 220.

The semiconductor package 200 further includes a mount member 251 and a mold resin 252. The semiconductor chip 250 is mounted over the interposer 210 through the mount member 251 in a way that its active side is opposite to the interposer 210. Electrode pads (not shown) are formed on the active side of the semiconductor chip 250. These electrode pads are coupled to bonding pads 271 of the semiconductor package 200 by bonding wires 270. The mold resin 252 seals the semiconductor chip 250, the bonding wires 270 and the interposer 210's surface bearing the semiconductor chip 250.

Figure 2:
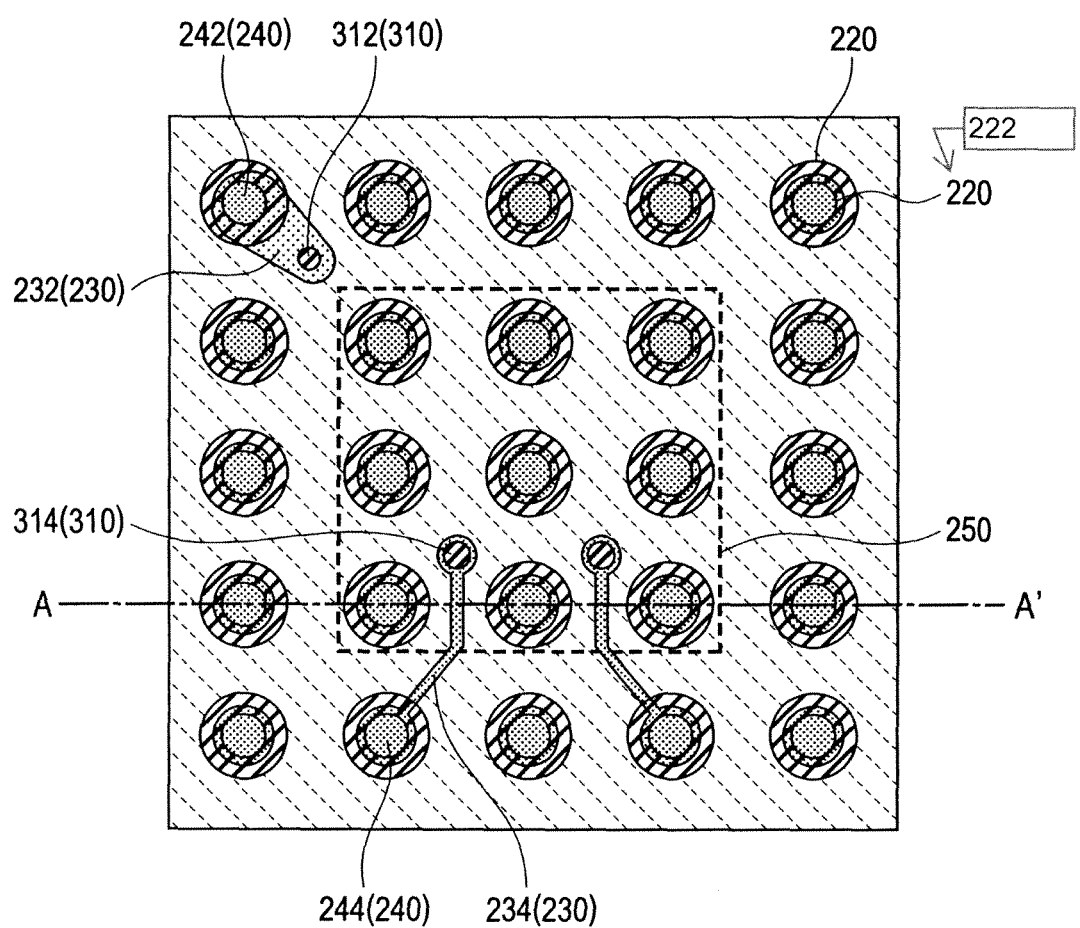
FIG. 2 is a plan view of a surface of an interposer according to the first embodiment before attachment of solder balls to the surface.

The interposer 210 includes a base member 211, a solder resist layer 215 and interconnect wire 236 which are formed on its surface to bear the semiconductor chip 250, and a solder resist layer 220 and interconnect wires 230 which are formed on its surface to be joined to the interconnection substrate 10. For example, the base member 211 is a glass epoxy board. The bonding pads 271 are provided on the interposer 210's surface to bear the semiconductor chip 250 and the external coupling terminals 240 and through holes 310 as shown in FIG. 2 are formed on its surface to be joined to the interconnection substrate 10. A conductor for coupling an interconnect wire 230 to the interconnect wire 236 is provided on the sidewall of each through hole 310. The through holes 310 are filled with the solder resist layer 220. For example, the underfill resin layer 100 is an epoxy resin layer. For example, the semiconductor package 200 is a BGA package like the one shown in FIG. 1.

FIG. 2 is a plan view of the interposer 210's surface to be joined to the interconnection substrate 10 before attachment of the solder balls 110 to the surface. FIG. 1 is a sectional view taken along the line A-A' of FIG. 2. The external coupling terminals 240 to which the solder balls 110 are attached are circular and two-dimensionally arranged, for example, in a grid pattern. A particular external coupling terminal 242 is coupled to a through hole 312 by an interconnect wire 232. A particular external coupling terminal 244 is coupled to a through hole 314 by an interconnect wire 234. The other external coupling terminals 240 are also coupled to through holes in the same way (not shown). The solder resist layer 220 has the shape of a ring and lies in the peripheral area of each external coupling terminal 240 and its vicinity. The solder resist layer 220 and external coupling terminal 240 are concentric with each other. The diameter of a solder resist opening 222 is smaller than that of an external coupling terminal 240. No solder resist layer 220 is formed over an interconnect wire 230 passing between external coupling terminals 240.

Figure 3A:
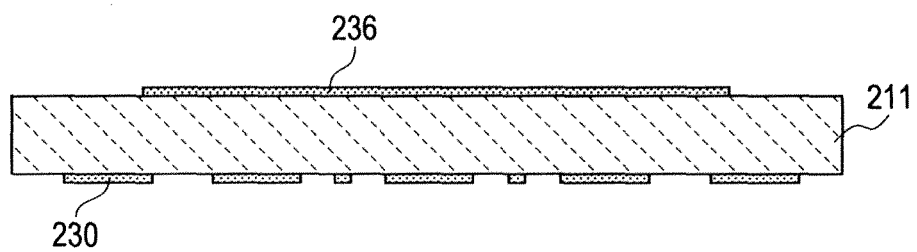
Figure 3B:
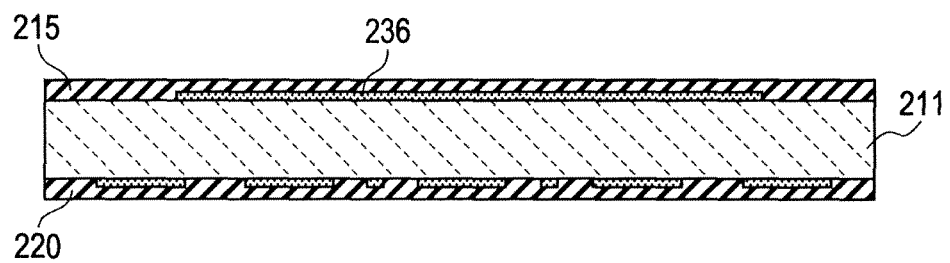
Figure 3C:
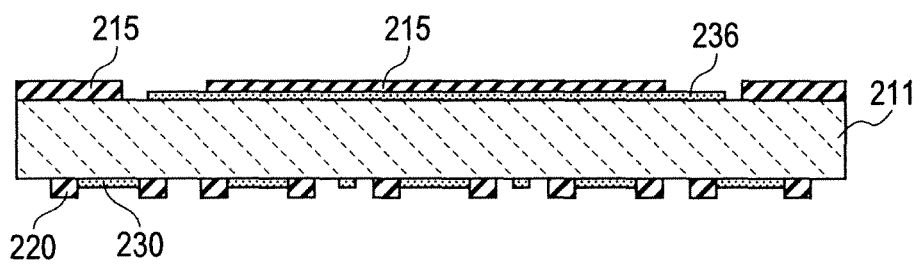
Figure 3D:
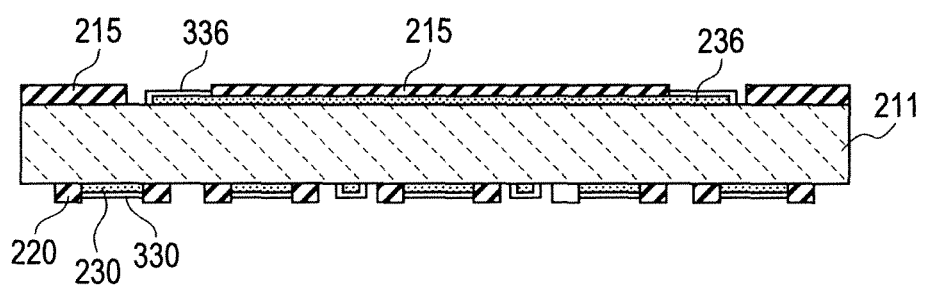

FIGS. 3A to 3D are sectional views showing the processes of manufacturing the interposer 210 shown in FIGS. 1 and 2. First, as shown in FIG. 3A, an interconnect wire 236 and interconnect wires 230 are formed on the front and back surfaces of the base member 211 respectively by patterning. Next, solder resist layers 215 and 220 are formed on the front and back surfaces respectively (FIG. 3B), then the solder resist layers 215 and 220 are selectively removed by photographic exposure and development processes to form a pattern as shown in FIG. 2 (FIG. 3C). Electrolytic Ni/Au coatings 330 and 336 are made over the exposed interconnect wires 230 and wire 236 using an electrolytic Ni/Au coating method (FIG. 3D). The interposer 210 is thus completed.

After that, the semiconductor chip 250 is mounted over the interposer 210 through the mount member 251. Then, the interposer 210 and semiconductor chip 250 are coupled to each other by the bonding wires 270. Then, the interposer 210, semiconductor chip 250, and bonding wires 270 are sealed with mold resin 252. The semiconductor package 200 is thus completed.

Figure 6:
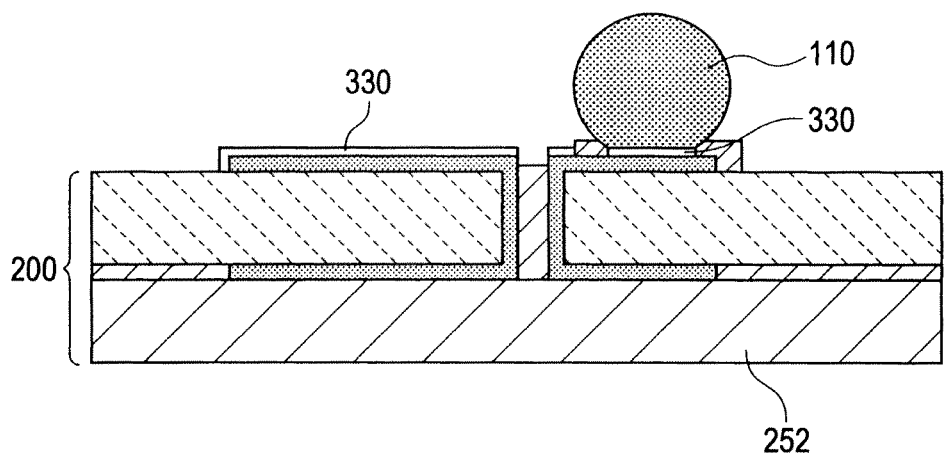
FIG. 6 is a sectional view showing the structure of a semiconductor package after a solder ball is attached.

After that, a solder ball 110 is attached to the semiconductor package 200 as shown in FIG. 6. The semiconductor package 200 and interconnection substrate 10 are joined through the solder balls 110. Then, the semiconductor package 200 is mounted over the interconnection substrate 10 and an underfill resin layer 100 is filled in the space between the semiconductor package 200 and interconnection substrate 10 to form the semiconductor device 1 as shown in FIG. 1.

Figure 7:
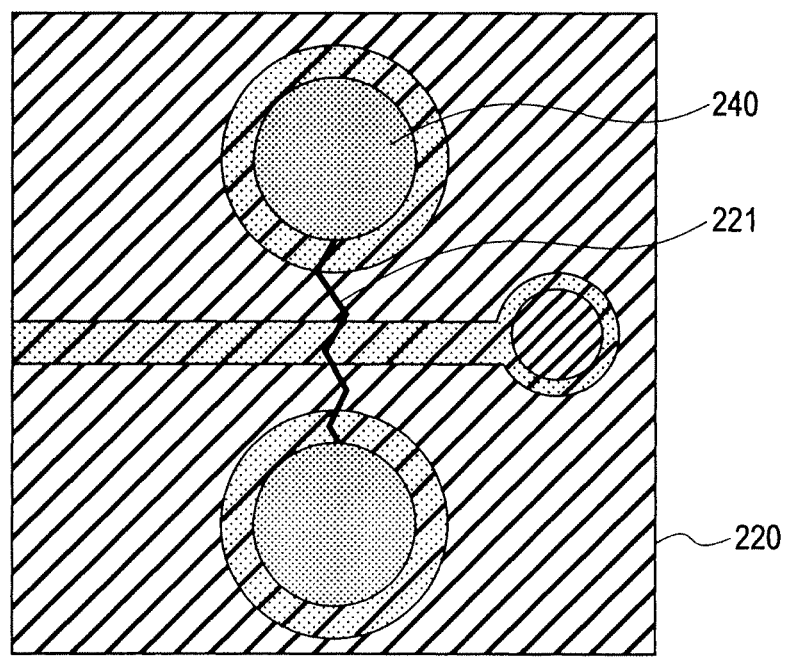
FIG. 7 is a plan view illustrating the problem to be solved by the present invention.

Next, the effect of this embodiment will be explained referring to FIGS. 1 and 7. In the semiconductor package 200 mounted over the interconnection substrate 10, a solder resist crack 221 may occur in the solder resist layer 220's area in contact with the underfill resin layer 100. It is thought that this occurs because thermal stress generated due to the difference in thermal expansion coefficient between the interconnection substrate 10 and semiconductor package 200 causes them to warp. As shown in FIG. 7, a solder resist crack 221 tends to occur in a narrow space between external coupling terminals 240 in the solder resist layer 220. Also, a solder resist crack 221 tends to occur in an area which overlaps the vicinity of an edge of the semiconductor chip 250 because expansion and contraction of the interposer 210 are restricted by the semiconductor chip 250.

In this embodiment, an interconnect wire 230 passing between external coupling terminals 240 is not covered by the solder resist layer 220. This means that a solder resist crack 221 never occurs on the interconnect wire 230. Therefore, disconnection of the interconnect wire 230 passing between the external coupling terminals 240 is prevented, thereby reducing the possibility of deterioration in the reliability of the semiconductor package 200.

Cracking hardly propagates inside the interposer 210 made of glass cloth impregnated with resin, so propagation of cracking into the interposer 210 is suppressed. Furthermore, the underfill resin layer 100 filled in the space between the semiconductor package 200 and interconnection substrate 10 prevents short-circuiting which can be caused by exposure of the interconnect wire 230.

Figure 4:
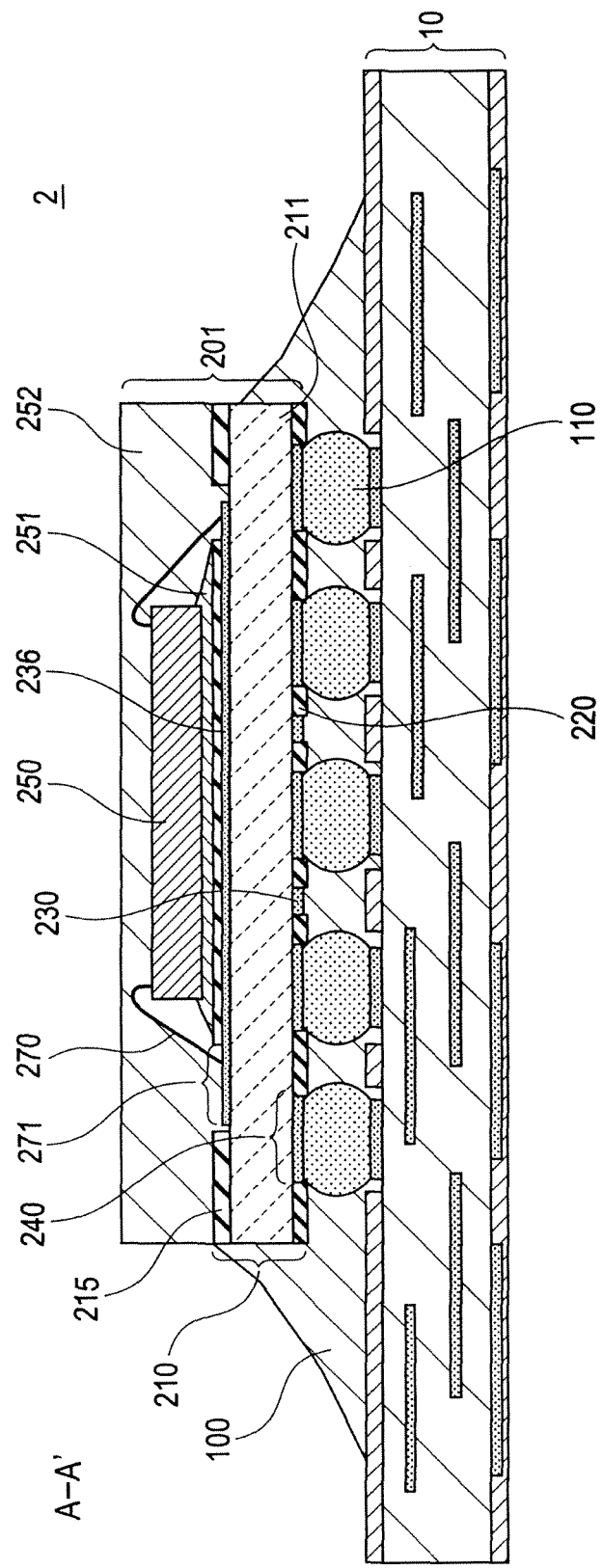
FIG. 4 is a sectional view showing the structure of a semiconductor device according to a second embodiment of the invention.
Figure 5:
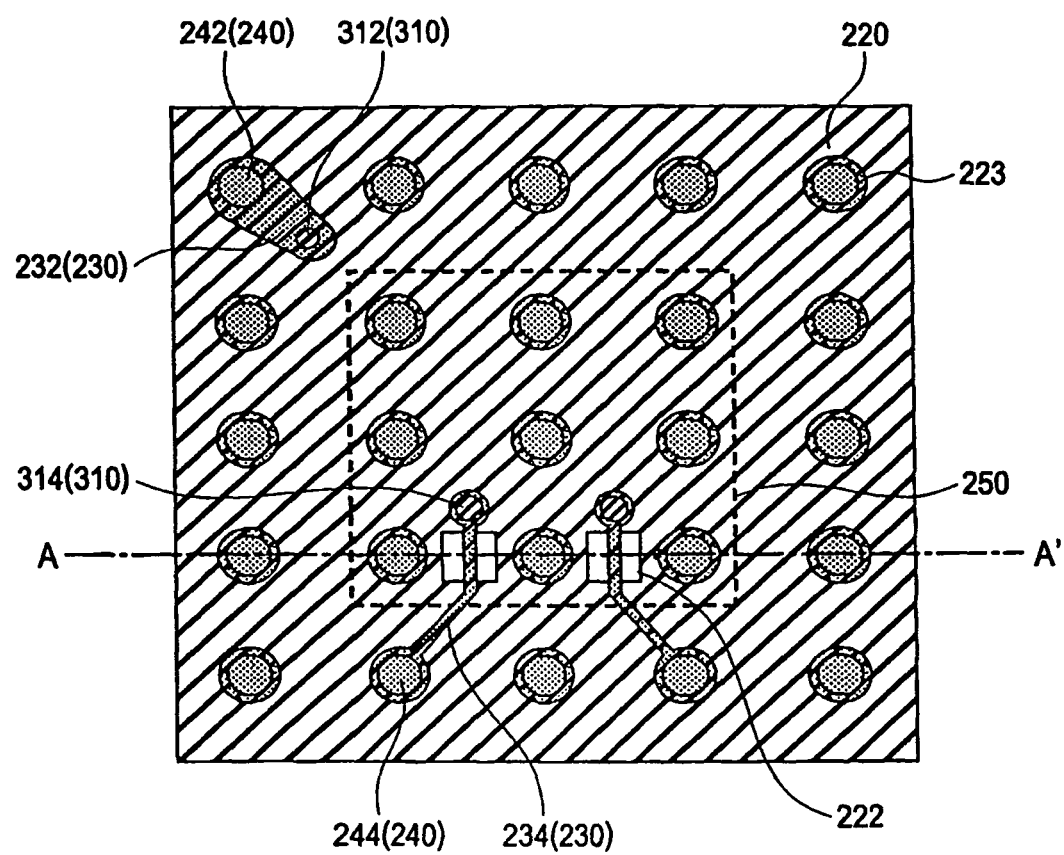
FIG. 5 is a plan view of a surface of an interposer according to the second embodiment before attachment of solder balls to the surface.

FIG. 4 is a sectional view showing the structure of a semiconductor device 2 according to a second embodiment of the invention, as a counterpart of FIG. 1 which shows the first embodiment. FIG. 5 is a plan view of the interposer 210's surface to be joined to the interconnection substrate 10 before attachment of the solder balls 110 to the surface in the semiconductor package 201 according to the second embodiment, as a counterpart of FIG. 2 which shows the first embodiment. FIG. 4 is a sectional view taken along the line A-A' of FIG. 5. The semiconductor device 2 and semiconductor package 201 according to the second embodiment are structurally the same as the semiconductor device 1 and semiconductor package 200 according to the first embodiment, except the pattern of the solder resist layer 220. The manufacturing method for the interposer 210 according to the second embodiment is the same as that for the interposer 210 according to the first embodiment.

As shown in FIG. 5, in the interposer 210 according to the second embodiment, a solder resist layer 220 is formed on the interposer 210's surface opposite to the interconnection substrate 10 except the areas of solder resist openings 223 over external coupling terminals 240 and solder resist openings 222. Each solder resist opening 223 lies over an external coupling terminal 240. Each solder resist opening 222 is formed over an interconnect wire 234 between external coupling terminals 240. Each interconnect wire 234 is passed between external coupling terminals 240 arranged along an edge of the semiconductor chip 250.

Since the semiconductor chip 250 restricts expansion and contraction of the interposer 210, a solder resist crack due to the difference in thermal expansion coefficient tends to occur in an area which overlaps the vicinity of an edge of the semiconductor chip 250. According to the second embodiment, a solder resist opening 222 is provided over an interconnect wire 230 passing between external coupling terminals 240 of the interposer 210, arranged along an edge of the semiconductor chip 250, and the solder resist layer 220 does not lie over the interconnect wire 230. Therefore, the same effect as in the first embodiment can be achieved in an area over each interconnect wire 230 passing between external coupling terminals 240 arranged along an edge of the semiconductor chip 250.

Furthermore, since the areas except the openings 222 and openings 223 are covered by the solder resist layer 220, the total area of electrolytic Ni/Au coatings 330 as shown in FIG. 3 is smaller than in the first embodiment. Consequently the semiconductor package manufacturing cost is lower. In addition, adhesion of foreign matter to interconnect wires is reduced during the semiconductor package manufacturing process.

Figure 8:
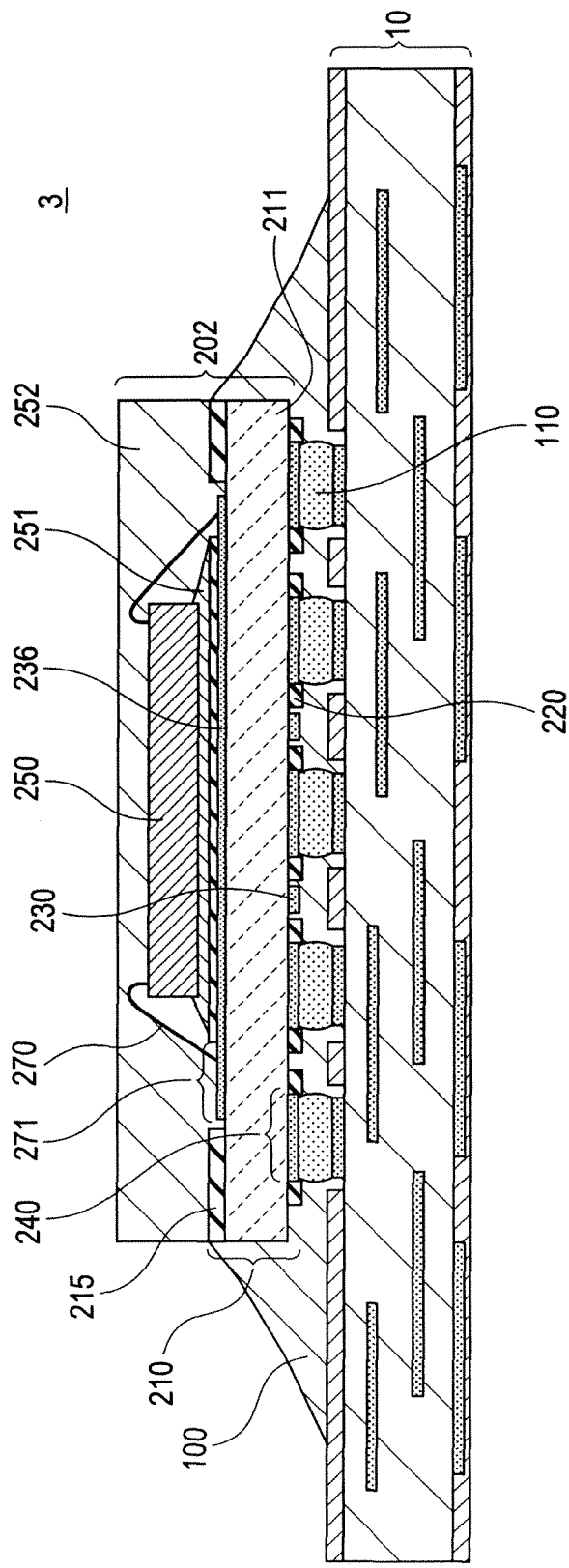
FIG. 8 is a sectional view showing the structure of a semiconductor device according to a third embodiment of the invention.

FIG. 8 is a sectional view showing the structure of a semiconductor device 3 according to a third embodiment of the invention, as a counterpart of FIG. 1 which shows the first embodiment. The semiconductor device 3 according to the third embodiment is structurally the same as the semiconductor device 1 according to the first embodiment, except that the semiconductor package 202 is an LGA package.

In the second embodiment as well, the solder resist layer 220 does not lie over an interconnect wire 230 passing between external coupling terminals 240 of the interposer 210, so the same effect as in the first embodiment can be achieved.

Figure 9:
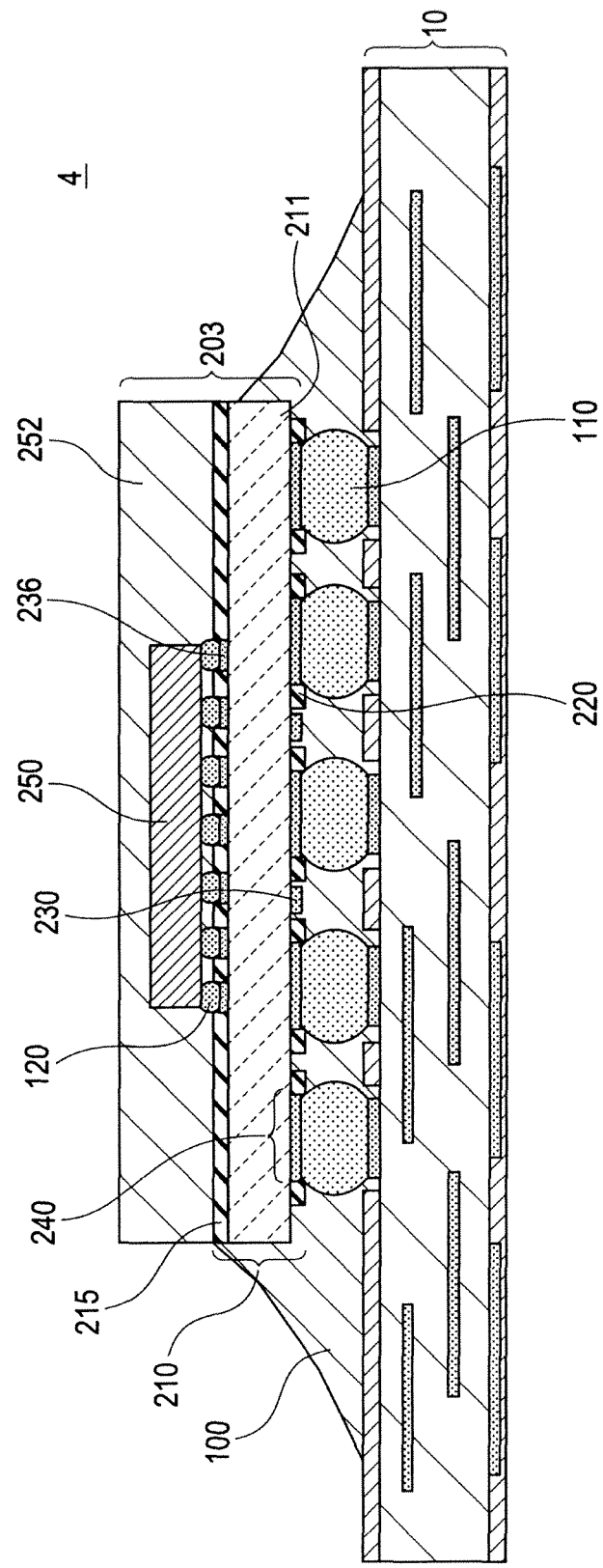
FIG. 9 is a sectional view showing the structure of a semiconductor device according to a fourth embodiment of the invention.

FIG. 9 is a sectional view showing the structure of a semiconductor device 4 according to a fourth embodiment of the invention, as a counterpart of FIG. 1 which shows the first embodiment. The semiconductor device 4 according to the fourth embodiment is structurally the same as the semiconductor device 1 according to the first embodiment, except that the semiconductor chip 250 is flip-chip coupled to the interposer 210 in the semiconductor package 203.

More specifically, the semiconductor chip 250 is mounted over the interposer 210 through bumps 120 with its active side facing the interposer 210. In the fourth embodiment as well, the solder resist layer 220 does not lie over an interconnect wire 230 passing between external coupling terminals 240 of the interposer 210, so the same effect as in the first embodiment can be achieved.

The preferred embodiments of the present invention have been so far described referring to the accompanying drawings. These embodiments are just illustrative of the invention. The invention can be embodied in other various forms.

What is claimed is:

1. A semiconductor device comprising:
    an interposer having
        a base member including a first surface and a second surface opposite to the first surface,
        a first interconnect formed on the first surface of the base member,
        a first insulating film formed on the first surface of the base member,
        a first external terminal and a second external terminal neighboring the first external terminal formed on the second surface of the base member,
        a second interconnect formed on the second surface of the base member and passing between the first external terminal and the second external terminal, and
        a second insulating film formed on the second surface of the base member,
    a semiconductor chip mounted on the first insulating film,
    a sealing resin formed on the first insulating film and sealing the semiconductor chip,
    wherein the second insulating film has an opening so that the second interconnect is exposed in an area where the second interconnect intersects with a line connecting centers of the first external terminal and the second external terminal.

2. The semiconductor package according to claim 1, wherein the first external terminal and the second external terminal are formed along an edge of the semiconductor chip.

3. The semiconductor package according to claim 2, wherein the opening is symmetric with respect to the line.

4. The semiconductor device according to claim 2, the interposer further comprising a bonding pad formed on the first surface of the base member, and the semiconductor device further comprising a bonding wire coupling the bonding pad of the interposer to the semiconductor chip.

5. The semiconductor device according to claim 4, wherein the base member comprises a glass cloth and a epoxy resin.

6. The semiconductor device according to claim 5, the interposer further having a through hole and a third external terminal,
    wherein the second interconnect has one end connected to the through hole and another end connected to the third external terminal.

7. The semiconductor device according to claim 6, wherein the through hole overlaps the semiconductor chip, and the third external terminal does not overlap the semiconductor chip, in a plan view.

8. The semiconductor device according to claim 1, wherein a metal film is formed on the second interconnect exposed from the second insulating film.

9. The semiconductor device according to claim 8, wherein the metal film comprises Ni.

10. The semiconductor device according to claim 1, further comprising:
    an interconnection substrate,
    an underfill resin layer filled between the second insulating film and the interconnection substrate.

* * * * *